(12) United States Patent
Ahlstedt et al.

(10) Patent No.: US 8,501,513 B2
(45) Date of Patent: Aug. 6, 2013

(54) OPTOELECTRONIC SEMICONDUCTOR COMPONENT WITH CURRENT SPREADING LAYER

(75) Inventors: Magnus Ahlstedt, Regensburg (DE); Dieter Eissler, Nittendorf (DE); Robert Walter, Parsberg (DE); Ralph Wirth, Mintraching-Auhof (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 357 days.

(21) Appl. No.: 11/992,706

(22) PCT Filed: Sep. 14, 2006

(86) PCT No.: PCT/DE2006/001617
§ 371 (c)(1),
(2), (4) Date: May 18, 2009

(87) PCT Pub. No.: WO2007/087769
PCT Pub. Date: Aug. 9, 2007

(65) Prior Publication Data
US 2009/0262773 A1 Oct. 22, 2009

(30) Foreign Application Priority Data
Sep. 27, 2005 (DE) .......................... 10 2005 046 190

(51) Int. Cl.
*H01L 33/00* (2010.01)
(52) U.S. Cl.
USPC ............... 438/37; 438/46; 438/47; 438/609; 257/99; 257/749; 257/E31.126; 257/E33.064

(58) Field of Classification Search
USPC ............................................ 257/749; 438/37
See application file for complete search history.

(56) References Cited

U.S. PATENT DOCUMENTS

| 4,495,514 | A | * | 1/1985 | Lawrence et al. | ............... 257/99 |
| 5,760,423 | A | * | 6/1998 | Kamakura et al. | ............... 257/99 |
| 5,861,636 | A |   | 1/1999 | Dutta et al. |  |
| 6,221,520 | B1 | * | 4/2001 | Takaki et al. | ................. 428/699 |
| 6,287,947 | B1 |   | 9/2001 | Ludowise et al. |  |

(Continued)

FOREIGN PATENT DOCUMENTS

| DE | 10203809 A1 | 8/2003 |
| DE | 10346606 A1 | 3/2005 |

(Continued)

OTHER PUBLICATIONS

I. Schnitzer et al., "30% external quantum efficiency from surface textured LEDs", Applied Physics Letters vol. 63, Oct. 1993, pp. 2174-2176

*Primary Examiner* — Jerome Jackson, Jr.
(74) *Attorney, Agent, or Firm* — Cozen O'Connor

(57) ABSTRACT

An optoelectronic semiconductor component comprising a semiconductor body (10) and a current spreading layer (3) is specified. The current spreading layer (3) is applied to the semiconductor body (10) at least in places. In this case, the current spreading layer (3) contains a metal (1) that forms a transparent electrically conductive metal oxide (2) in the current spreading layer, and the concentration (x) of the metal (1) decreases from that side of the current spreading layer (3) which faces the semiconductor body (10) toward that side of said current spreading layer which is remote from the semiconductor body (10). A method for producing such a semiconductor component is also disclosed.

7 Claims, 2 Drawing Sheets

U.S. PATENT DOCUMENTS

| | | |
|---|---|---|
| 6,693,352 B1 | 2/2004 | Huang et al. |
| 6,777,257 B2 | 8/2004 | Shinohara et al. |
| 2003/0141604 A1 | 7/2003 | Eisert et al. |
| 2004/0135166 A1 | 7/2004 | Yamada et al. |
| 2007/0181894 A1 | 8/2007 | Stein et al. |

FOREIGN PATENT DOCUMENTS

| | | | |
|---|---|---|---|
| EP | 1523047 A2 | | 4/2005 |
| JP | 7-283167 | | 10/1995 |
| JP | 2002-314132 | | 10/2002 |
| JP | 2002-353499 | | 12/2002 |
| JP | 2004 146539 A | | 5/2004 |
| JP | 2005-150772 | | 6/2005 |
| JP | 2005-244128 | | 9/2005 |
| JP | 2005 244128 | * | 9/2005 |
| WO | WO 2005/024961 | | 3/2005 |
| WO | WO 2005/0224961 A | | 3/2005 |

\* cited by examiner

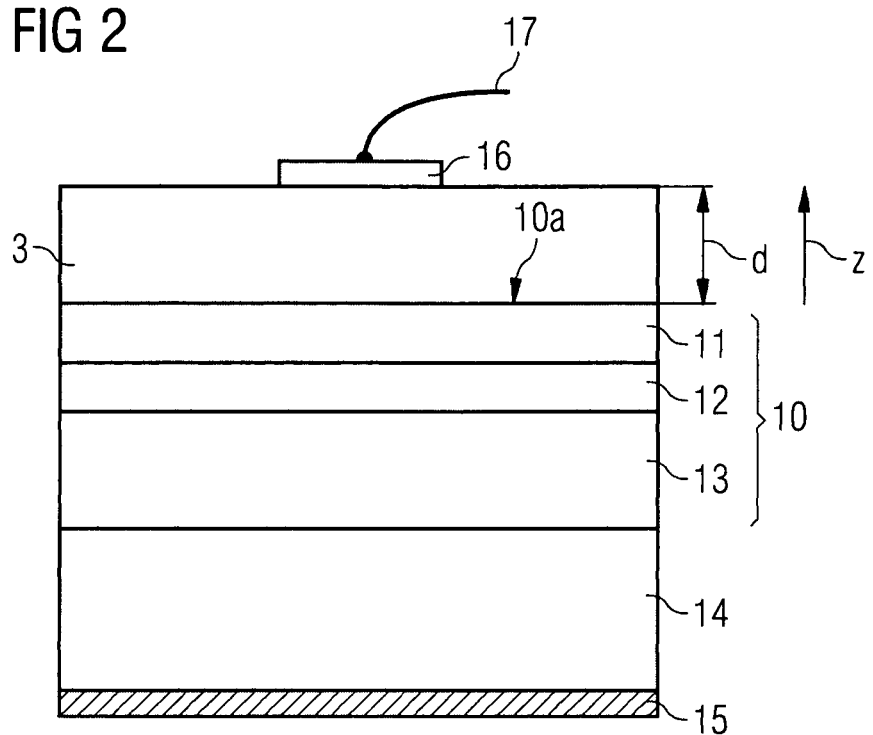
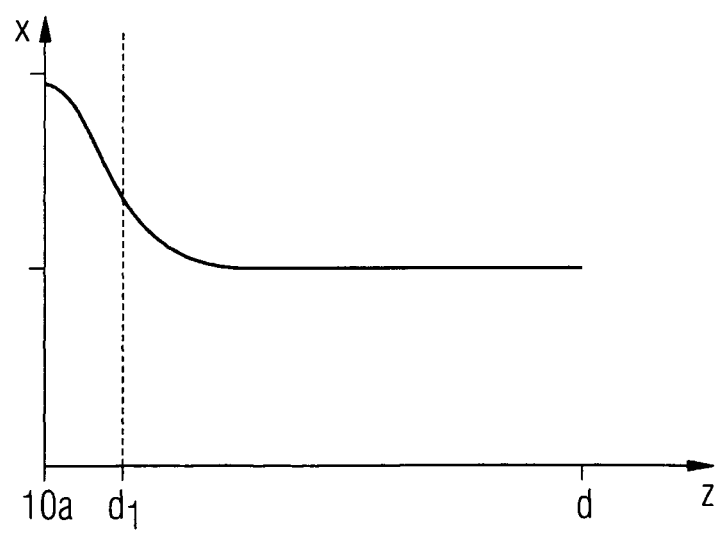

OPTOELECTRONIC SEMICONDUCTOR COMPONENT WITH CURRENT SPREADING LAYER

RELATED APPLICATIONS

This is a U.S. national stage of application No. PCT/DE2006/001617, filed on 14 Sep. 2006.

This patent application claims the priority of German patent application no. 10 2005 046190.5 filed 27 Sep. 2005, the disclosure content of which is hereby incorporated by reference.

FIELD OF THE INVENTION

The present invention relates to an optoelectronic semiconductor component having a current spreading layer that is transmissive at least to part of the electromagnetic radiation that is generated by the component.

BACKGROUND OF THE INVENTION

The document EP 1 523 047 A2 describes an optoelectronic semiconductor component.

SUMMARY OF THE INVENTION

One object of the invention is to provide an optoelectronic semiconductor component which has an electrically and mechanically particularly stable contact-connection. A further object is to provide a method for producing such an optoelectronic semiconductor component.

In accordance with at least one embodiment, the optoelectronic semiconductor component comprises a semiconductor body. The semiconductor body contains for example a semiconductor layer sequence suitable for generating radiation or for converting electromagnetic radiation into electrical charges. By way of example, the semiconductor body is an epitaxially grown semiconductor body.

In accordance with at least one embodiment of the optoelectronic semiconductor component, a current spreading layer is applied to the semiconductor body at least in places. The current spreading layer is preferably distinguished by a particularly good electrical transverse conductivity. That is to say that the current spreading layer is suitable for distributing a current impressed into the current spreading layer in a limited region of said layer over a larger area. The current spreading layer is particularly well suited to conducting the electric current impressed into it in directions parallel to a main area of the current spreading layer.

Preferably, the current spreading layer is additionally transmissive at least to part of the electromagnetic radiation that is generated in the optoelectronic semiconductor chip or received by the optoelectronic semiconductor chip. In this case, the transmissivity of the current spreading layer is preferably at least 90 percent for electromagnetic radiation in the visible spectral range.

In accordance with at least one embodiment of the optoelectronic semiconductor component, the current spreading layer contains a metal that forms a transparent electrically conductive metal oxide in the current spreading layer. That is to say that the current spreading layer contains a transparent electrically conductive metal oxide at least in places. Preferably, the current spreading layer in this case comprises a material from the group of so-called transparent conductive oxides (TCO). Furthermore, it is possible for the metal oxide of the current spreading layer to be doped in n- or p-conducting fashion with a further material—for example a metal or a semiconductor.

In accordance with at least one embodiment of the optoelectronic semiconductor component, the concentration of the metal that forms an oxide in the current spreading layer decreases from that side of the current spreading layer which faces the semiconductor body toward that side of the current spreading layer which is remote from the semiconductor body. That is to say that the metal concentration is highest on that side of the current spreading layer which faces the semiconductor body. By way of example, the concentration of the metal can be up to 100 percent there. That is to say that there the current spreading layer can comprise a region which consists of the metal. The concentration of the metal in the current spreading layer then decreases with increasing distance from the semiconductor body. The concentration of oxygen correspondingly increases. By way of example, the metal oxide of the current spreading layer can have a stoichiometric composition in places on its side remote from the semiconductor body.

In accordance with at least one embodiment, an optoelectronic semiconductor component comprising a semiconductor body is specified. The optoelectronic component has a current spreading layer, which is applied to the semiconductor body at least in places. The current spreading layer contains a metal that forms a transparent electrically conductive metal oxide in the current spreading layer, and the concentration of the metal decreases from that side of the current spreading layer which faces the semiconductor body toward that side of said current spreading layer which is remote from the semiconductor body.

In this case, the optoelectronic semiconductor component makes use of the insight, inter alia, that a metal concentration that is as high as possible at the interface between semiconductor body and current spreading layer enables a particularly good ohmic contact between semiconductor body and current spreading layer. Furthermore, it has been found that as a result of the increased metal concentration at the semiconductor body, the current spreading layer adheres to the semiconductor body particularly well and the risk of the current spreading layer being detached from the semiconductor body is reduced as a result. Furthermore, the current spreading layer can be produced in a particularly simple manner if the metal-rich region of the current spreading layer—that is to say the region of the current spreading layer in the vicinity of the semiconductor body—comprises the metal that forms the metal oxide in the current spreading layer.

In accordance with at least one embodiment of the optoelectronic semiconductor component, the metal concentration decreases continuously in the current spreading layer. In other words, the metal concentration does not change abruptly in such a way that only non-oxidized metal is contained in one region of the current spreading layer and only metal oxide is contained in an adjacent region of the current spreading layer. Rather, the transition from a metal-rich to a metal-poorer region of the current spreading layer is smooth.

In accordance with at least one embodiment of the optoelectronic semiconductor chip, the current spreading layer comprises in places a metal oxide having a stoichiometric composition. That is to say that there are regions in the current spreading layer in which a metal oxide is present in a stoichiometric composition. By way of example, the current spreading layer has a high metal concentration in the vicinity of the semiconductor body. With increasing distance from the semiconductor body, the metal concentration can then fall in such a way that a metal oxide having a stoichiometric composition is present in places on that side of the current spreading layer which is remote from the semiconductor body. In other words, there are regions of the current spreading layer in which metal atoms present there are in each case bonded to at least one oxygen atom.

In accordance with at least one embodiment of the optoelectronic semiconductor component, the current spreading layer has oxides of at least one of the following metals or metal alloys: indium, tin, indium-tin, zinc, cadmium, titanium. Possible oxides in the current spreading layer are then provided for example by the following oxides: $ZnO$, $SnO_2$, $In_2O_3$, $Zn_2SnO_4$, $CdSnO_3$, $ZnSnO_3$, $MgIn_2O_4$, $GaInO_3$, $Zn_2In_2O_5$, $In_4Sn_3O_{12}$ or mixtures.

Furthermore, it is possible for the metal oxides to be doped in n- or p-conducting fashion.

In accordance with at least one embodiment, the current spreading layer is applied to a radiation passage area of the optoelectronic semiconductor component. In this case, the radiation passage area is an area of the optoelectronic semiconductor component through which electromagnetic radiation enters into the semiconductor body or through which electromagnetic radiation emerges from the semiconductor body. In this case, the optoelectronic semiconductor component can be for example one of the following components: photodiode chip, light emitting diode chip, laser diode chip.

A method for producing an optoelectronic component is furthermore specified. By way of example, an optoelectronic semiconductor component in accordance with at least one of the embodiments described above can be produced by means of the method.

In accordance with at least one embodiment of the method for producing an optoelectronic semiconductor component, firstly a layer comprising a metal is applied to the surface of a semiconductor body at least in places. By way of example, the metal layer is applied to the radiation passage area of the semiconductor body.

Preferably, the thickness of the metal layer is between at least 0.2 and at most 3.0 nanometers. Particularly preferably, the layer thickness of the metal layer is between 0.3 and 2.0 nanometers. In this case, the layer thickness is preferably chosen to be so thin that it is transmissive to a large part of the electromagnetic radiation that is emitted by the optoelectronic semiconductor component during operation or is to be received by the optoelectronic semiconductor component.

The metal layer preferably contains or consists of one of the metals mentioned above. That is to say that it contains or consists of at least one of the following metals: indium, tin, indium-tin, zinc, cadmium, titanium. Furthermore, the metal layer can also contain metal alloys such as gold-zinc (AuZn), for example, or consist of such alloys.

In accordance with at least one embodiment of the method for producing the optoelectronic semiconductor component, in a subsequent method step a layer comprising an oxide of a metal of the metal layer is applied to the metal layer. By way of example, the metal oxide layer contains or consists of at least one of the following metal oxides: $ZnO$, $SnO_2$, $In_2O_3$, $Zn_2SnO_4$, $ZnSnO_3$, $CdSnO_3$, $MgIn_2O_4$, $GaInO_3$, $Zn_2In_2O_5$, $In_4Sn_3O_{12}$.

In accordance with at least one embodiment of the method for producing an optoelectronic semiconductor component, the layer sequence that is composed of metal layer and metal oxide layer and has been applied to the semiconductor body is subsequently subjected to thermal treatment. For this purpose, the layer sequence applied is heated for example to temperatures of between 200 and 600 degrees Celsius, preferably to temperatures of between 300 and 500 degrees Celsius. This temperature range proves to be particularly advantageous for producing a current spreading layer having particularly good electrical conductivity.

The layer sequence can be heated for example in a furnace with 0 to 20% oxygen partial pressure, particularly preferably 2 to 10% oxygen partial pressure. This partial pressure range proves to be particularly advantageous for producing a current spreading layer having particularly good electrical conductivity.

An RTA (rapid thermal annealing) technique can also be used when heating the layer sequence. Furthermore, it is possible for the layer sequence to be heated under an $N_2$, $N_2/Ar$ or $N_2/H_2$ atmosphere.

Preferably, the layer sequence is heated for times of between 1 and 5 minutes. This range of the duration of heating the layer sequence proves to be particularly advantageous for producing a current spreading layer having a particularly good electrical conductivity.

In accordance with at least one embodiment of the method for producing an optoelectronic semiconductor component, at least one layer comprising a metal is applied to a semiconductor body. In a subsequent method step, a layer comprising an oxide of the metal is applied to the metal layer. In a further method step, the applied layer sequence composed of metal layer and metal oxide layer is subjected to thermal treatment.

In this case, the method described makes use of the insight, inter alia, that a thorough reaction of the metal layer and the metal oxide layer is made possible by the thermal treatment. As a result, a profile of the metal concentration can be produced in the current spreading layer. In this case, the concentration of the metal in the current spreading layer decreases in a direction away from the semiconductor body. A desired profile of the metal concentration in the current spreading layer can be produced by means of the temperature and duration of the thermal treatment.

In this case, the method described here makes use of the idea, inter alia, that a mechanically and electrically particularly stable ohmic contact between semiconductor body and current spreading layer can be produced by means of the thin metal layer at the interface between current spreading layer and semiconductor body. Furthermore, the metal layer can serve for improving the doping of the current spreading layer at the interface between semiconductor body and current spreading layer.

In accordance with at least one embodiment of the method for producing an optoelectronic semiconductor component, in order to produce the current spreading layer, a metal is applied to the semiconductor body, wherein the applied metal is oxidized at an increasing rate in the course of the application or coating process. That is to say, for example, that the oxygen flow is increased during the coating of the semiconductor body with a metal, such that an ever increasing portion of the applied metal is oxidized in the course of coating. In this way, it is possible to produce a current spreading layer in which the metal concentration decreases with increasing distance from the semiconductor body and the oxygen concentration increases. By way of example, the coating for this purpose can be effected by means of reactive sputtering of the metal, wherein the oxygen flow is increased in the course of the coating process.

In this case, it is generally possible for the current spreading layer to be applied by means of a PVD (short for physical vapor deposition) or a CVD (short for chemical vapor deposition) method. In this case, the oxygen concentration is preferably enriched during the deposition process. In this case, the oxygen concentration in the current spreading layer is set in such a way that a metal oxide layer having good conductivity results.

In this case, the method makes use of the idea, inter alia, that the metal concentration in the growing current spreading layer can be controlled by means of the oxygen supply. In this way, it is possible to set a predeterminable profile of the metal concentration in the current spreading layer.

In accordance with at least one embodiment of the method for producing an optoelectronic semiconductor component, the oxygen flow is increased continuously during the coating process.

BRIEF DESCRIPTION OF THE DRAWINGS

FIG. 2 shows a schematic sectional illustration of an exemplary embodiment of the optoelectronic semiconductor component described here.

FIG. 3 schematically shows the profile of the metal concentration in the current spreading layer of an exemplary embodiment of the optoelectronic semiconductor component described here.

DETAILED DESCRIPTION OF THE DRAWINGS

In the exemplary embodiments and figures, identical or identically acting component parts are in each case provided with the same reference symbols. The component parts illustrated and also the size relationships of the component parts among one another should not be regarded as true to scale. Rather, some details of the figures are illustrated with an exaggerated size in order to afford a better understanding.

Figure 1A:
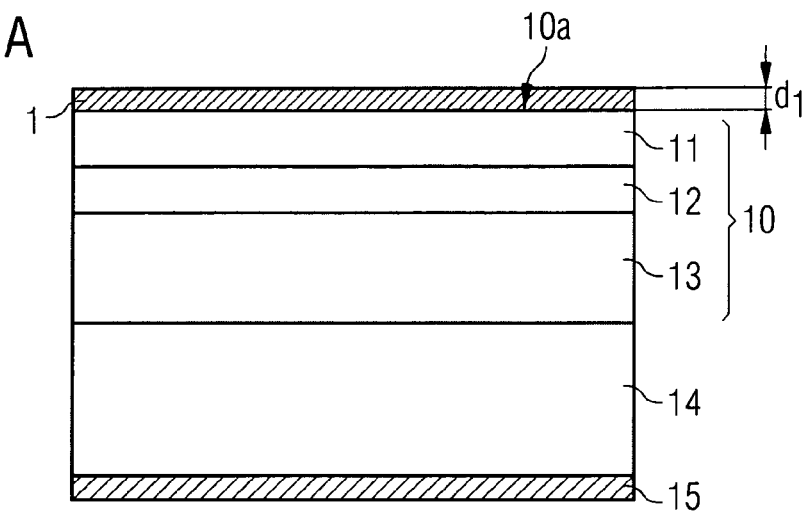
FIGS. 1A, 1B and 1C show schematic sectional illustrations for elucidating an exemplary embodiment of the method for producing an optoelectronic semiconductor component described here.
Figure 1B:
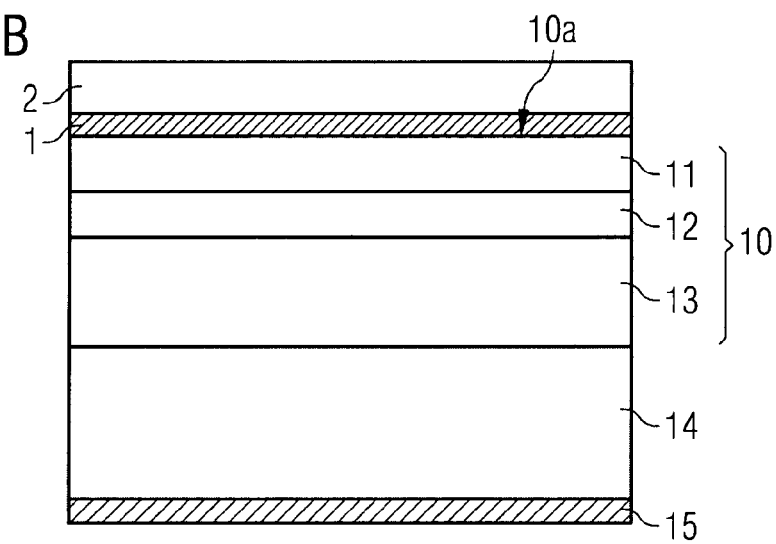
Figure 1C:
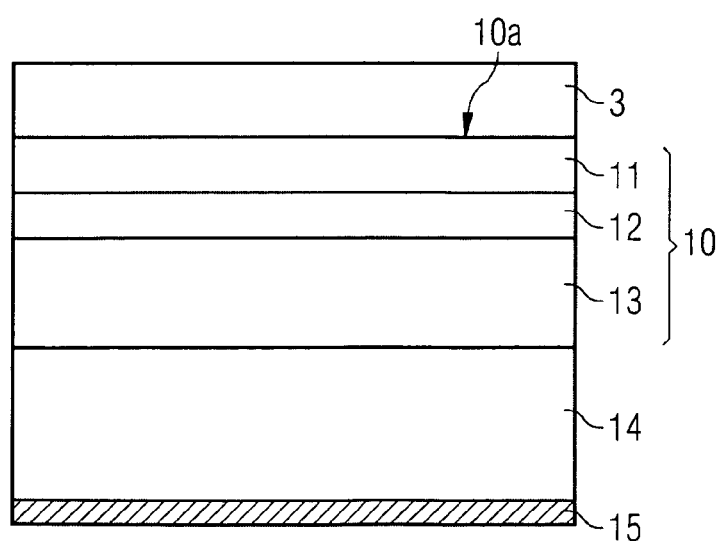

FIGS. 1A to 1C show schematic sectional illustrations for elucidating a first exemplary embodiment of the method for producing an optoelectronic semiconductor component.

FIG. 1A shows a schematic sectional illustration of a semiconductor body 10. The semiconductor body 10 comprises a cladding layer 11, which can be doped in p-conducting fashion, for example. In this case, the cladding layer 11 can be doped for example with a p-type dopant. The semiconductor body 10 furthermore comprises an active zone 12 comprising for example an epitaxial layer sequence suitable for generating radiation. The epitaxial layer sequence can contain for example a pn junction, a quantum well structure, or a multiple quantum well structure.

In the context of the application, the designation quantum well structure also encompasses any structure in which charge carriers experience a quantization of their energy states as a result of confinement. In particular, the designation quantum well structure does not comprise any indication about the dimensionality of the quantization. It therefore encompasses, inter alia, quantum wells, quantum wires and quantum dots and any combination of these structures.

The epitaxial layer sequence is preferably based on a phosphide, arsenide or nitride compound semiconductor material.

In this connection, "based on phosphide compound semiconductors" means that a component designated in this way or part of a component preferably comprises $Al_nGa_mIn_{1-n-m}P$ where $0 \leq n \leq 1$, $0 \leq m \leq 1$ and $n+m \leq 1$. In this case, this material need not necessarily have a mathematically exact composition according to the above formula. Rather, it can have one or a plurality of dopants and additional constituents which essentially do not change the physical properties of the material. For the sake of simplicity, however, the above formula only comprises the essential constituents of the crystal lattice (Al, Ga, In, P), even if these can be replaced in part by small quantities of further substances.

In this connection, "based on arsenide compound semiconductors" means that a component designated in this way or part of a component preferably comprises $Al_nGa_mIn_{1-n-m}As$ where $0 \leq n \leq 1$, $0 \leq m \leq 1$ and $n+m \leq 1$. In this case, this material need not necessarily have a mathematically exact composition according to the above formula. Rather, it can have one or a plurality of dopants and additional constituents which essentially do not change the physical properties of the material. For the sake of simplicity, however, the above formula only comprises the essential constituents of the crystal lattice (Al, Ga, In, As), even if these can be replaced in part by small quantities of further substances.

In the present connection, "based on nitride compound semiconductors" means that the active epitaxial layer sequence or at least one layer thereof comprises a nitride III/V compound semiconductor material, preferably $Al_nGa_mIn_{1-n-m}N$ where $0 \leq n \leq 1$, $0 \leq m \leq 1$ and $n+m \leq 1$. In this case, this material need not necessarily have a mathematically exact composition according to the above formula. Rather, it can have one or a plurality of dopants and additional constituents which essentially do not change the characteristic physical properties of the $Al_nGa_mIn_{1-n-m}N$ material. For the sake of simplicity, however, the above formula only comprises the essential constituents of the crystal lattice (Al, Ga, In, N), even if these can be replaced in part by small quantities of further substances.

Furthermore, the semiconductor body 10 preferably comprises a cladding layer 13, which can be n-conducting. By way of example, the cladding layer 13 is doped with an n-type dopant for this purpose.

The semiconductor body 10 is preferably applied on a carrier 14. The carrier 14 can be a growth substrate for the layers of the semiconductor body 10. The semiconductor body 10 is then grown epitaxially onto the carrier 14. Furthermore, the carrier 14 can be a carrier element to which the semiconductor body 10 has been applied subsequently, that is to say after conclusion of the growth of the semiconductor body 10.

In the latter case, the optoelectronic semiconductor chip is a so-called thin-film chip.

The carrier 14 of the semiconductor component can then be chosen relatively freely, compared with a growth substrate. Preferably, a carrier 14 is chosen which is adapted particularly well to the radiation-generating epitaxial layer sequence 12 with regard to its coefficient of thermal expansion. Furthermore, the carrier 14 can contain a material having particularly good thermal conductivity. In this way, the heat generated during operation is dissipated particularly efficiently to a further carrier—for instance a printed circuit board.

Thin-film semiconductor components are furthermore preferably distinguished by at least one of the following features:

a reflective layer or layer sequence is applied or formed at a first main area—facing the carrier 14—of the radiation-generating epitaxial layer sequence 12, said layer or layer sequence reflecting at least part of the electromagnetic radiation generated in the epitaxial layer sequence 12 back into the latter.

The epitaxial layer sequence 12 preferably has a thickness of at most 20 μm, particularly preferably at most 10 μm.

Furthermore, the semiconductor body 10 preferably contains at least one semiconductor layer with at least one area having an intermixing structure. Said intermixing structure ideally leads to an approximately ergodic distribution of the light.

A basic principle of a thin-film light emitting diode chip is described for example in the document I. Schnitzer et al., "30% external quantum efficiency from surfaces texured with LEDs", Appl. Phys. Lett. 63(16), 18 Oct. 1993, pages 2174 to 2176, the disclosure content of which is hereby incorporated by reference.

The semiconductor body 10 furthermore preferably has a radiation passage area 10a, through which a large part of the electromagnetic radiation emitted by the optoelectronic semiconductor chip, for example, is coupled out. Particularly preferably, the entire radiation emitted by the optoelectronic semiconductor component emerges through the radiation passage area 10a. The radiation passage area 10a is formed for example by a part of the surface of the semiconductor body 10. Preferably, the radiation passage area 10a is provided by a main area of the semiconductor body 10 which is arranged for example parallel to an epitaxial layer sequence 12 of the semiconductor body 10 which is suitable for generating electromagnetic radiation.

The semiconductor body 10 can, moreover, comprise further layers that are not shown. By way of example, the semiconductor body 10 can comprise buffer layers for adapting lattice differences between one or more of the layers described.

A contact layer 15 is preferably applied on that surface of the carrier 14 which is remote from the semiconductor body. The contact layer 15 is a contact metallization, for example. Via the contact metallization, the optoelectronic semiconductor component can be contact-connected on the n side, for example.

In the first exemplary embodiment of the method for producing an optoelectronic semiconductor component as explained in conjunction with FIG. 1A, firstly a thin metal layer 1 is applied to the radiation passage area 10a of the semiconductor body 10.

The metal layer 1 can be applied for example by PVD or CVD coating techniques at a temperature of preferably between 150 degrees Celsius and 350 degrees Celsius. The following coating methods are preferred here: sputtering, magnetron sputtering, DC sputtering, electron beam evaporation.

The thickness d1 of the metal layer 1 is preferably between 0.2 and 3.0 nanometers, particularly preferably between 0.3 and 2.0 nanometers. In this case, the thickness d1 is chosen to be so thin that the metal layer 1 is transparent to a large part of the electromagnetic radiation generated during operation of the optoelectronic semiconductor component, for example. The metal layer 1 preferably contains one of the following metals or consists of one of the following metals: indium, tin, indium-tin, zinc, cadmium, titanium. In the exemplary embodiment of the method described, the metal layer 1 consists of zinc or of a gold-zinc alloy.

A further method step is described in conjunction with FIG. 1B. In this method step, a metal oxide layer 2 is applied to the metal layer 1.

The metal oxide layer 2 can be applied for example by PVD or CVD coating techniques. The following coating methods are preferred here: sputtering, magnetron sputtering, DC sputtering, electron beam evaporation.

The metal oxide layer 2 preferably has a thickness of at least 50 nanometers, particularly preferably of at least 200 nanometers. It contains a transparent electrically conductive metal oxide (TCO). In this case, the metal oxide layer contains an oxide of at least one metal of the metal layer 1 or consists of said oxide. Preferably, the metal oxide layer 2 contains or consists of one of the following metal oxides: $ZnO$, $SnO_2$, $In_2O_3$, $Zn_2SnO_4$, $CdSnO_3$, $ZnSnO_3$, $MgIn_2O_4$, $GaInO_3$, $Zn_2In_2O_5$, $In_4Sn_3O_{12}$ or mixtures.

If the metal layer 1 is a zinc or gold-zinc layer, for example, then the metal oxide layer preferably contains a zinc oxide or a p-conducting zinc oxide doped with aluminum (ZnO:Al).

A further step of the method in accordance with a first exemplary embodiment for producing an optoelectronic semiconductor component is described in conjunction with FIG. 1C. After the metal oxide layer 2 has been applied to the metal layer 1, the applied layer sequence is preferably subjected to thermal treatment. For this purpose, the layer sequence is heated to temperatures of between 30 degrees Celsius and 1000 degrees Celsius, preferably between 200 degrees Celsius and 600 degrees Celsius, particularly preferably between 300 degrees Celsius and 500 degrees Celsius. As a result, the material of the metal layer 1 and of the metal oxide layer 2 thoroughly reacts to form a current spreading layer 3 having the thickness d.

The layer sequence can be heated for example in a furnace with 0 to 20% oxygen partial pressure, particularly preferably 2 to 10% oxygen partial pressure. An RTA (rapid thermal annealing) technique can also be used when heating the layer sequence. Furthermore, it is possible for the layer sequence to be heated under an $N_2$, $N_2/Ar$ or $N_2/H_2$ atmosphere. The layer sequence is preferably heated for times of between 1 and 5 minutes.

FIG. 2 shows an optoelectronic semiconductor component produced for example by means of the method described in conjunction with FIGS. 1A to 1C. A wire connection location 16 (bonding pad) is applied there to the current spreading layer 3, a connection wire 17 being connected to said location. By means of the connection wire 17, electric current can be impressed into the current spreading layer 3 via the wire connection location 16. The current is distributed there in directions parallel to the radiation passage area 10a—that is to say in the transverse direction—in such a way that the impressed current is distributed as uniformly as possible over the entire radiation passage area 10a. The active zone 12 of the semiconductor body 10 can be energized particularly uniformly in this way.

In the current spreading layer 3, a profile of the metal concentration x such as is illustrated schematically in FIG. 3 is established for example as a result of the thermal treatment described in conjunction with FIG. 1C. In this case, in the vicinity of the radiation passage area 10a the metal concentration is particularly high and can be for example up to 100 percent. In this case, an average metal concentration x is involved, for example, where the metal concentration is averaged depending on the distance z from the radiation passage area 10a in each case over that area of the current spreading layer 3 which is parallel to the radiation passage area 10a.

Owing to the thermal treatment, for example, metal passes into the metal oxide layer 2 for example by means of diffusion from the metal layer 1. This results in a quasi-continuous profile of the metal concentration x, wherein the metal concentration x decreases continuously with increasing distance from the radiation passage area 10a in the direction z. That is to say that at the distance d1 corresponding to the layer thickness of the original metal layer 1, the metal concentration x does not suddenly fall abruptly, rather the transition between original metal layer 1 and metal oxide layer 2 is smooth with regard to the metal concentration x. The gradient of the fall in the metal concentration x and the metal concentration as a function of the distance from the radiation passage area 10a can be set here inter alia by means of the temperature during the thermal treatment of the layers 1, 2 and also by means of the duration of the thermal treatment.

In this case, the metal concentration profile established in the current spreading layer 3 depends on the materials used and the desired conductivity of the current spreading layer 3.

The profile of the metal concentration x in the current spreading layer 3 can be set particularly precisely by means of a second exemplary embodiment of the method for producing an optoelectronic semiconductor component. In this method, the metal is applied with supply of oxygen, that is to say, for example, in an oxygen atmosphere. In this case, the oxygen flow is varied during the coating process. By way of example, the oxygen flow is increased continuously during the coating process until a desired, predeterminable oxygen content has been reached in the metal oxide layer 2. That is to say that this method does not involve firstly applying a pure metal layer 1 and then applying a pure metal oxide layer 2, rather a metal oxide layer is applied in which the oxygen content is varied in a controlled manner during the coating process. In this case, a metal layer in which the oxygen content is zero or approximately zero can be applied at the beginning of the method. This gives rise to a current spreading layer 3 in which the profile of the metal concentration x as a function of the distance from the radiation passage area 10a can be set with the aid of the oxygen flow.

By way of example, a ZnO layer is applied to the semiconductor body 10 by reactive sputtering of zinc from a zinc target wherein the oxygen flow is increased during the sputtering process.

The invention is not restricted by the description on the basis of the exemplary embodiments. Rather, the invention encompasses any new feature and also any combination of features, which in particular comprises any combination of features in the patent claims, even if this feature or this combination itself is not explicitly specified in the patent claims or exemplary embodiments.

The invention claimed is:

1. A method for producing an optoelectronic semiconductor component comprising a semiconductor body having a semiconductor layer sequence which generates electro-magnetic radiation or which converts electromagnetic radiation into electrical charges; and a current spreading layer, which is applied to the semiconductor body at least in places; the current spreading layer containing a metal that forms a transparent electrically conductive metal oxide in the current spreading layer, a concentration of the metal decreasing from that side of the current spreading layer which faces the semiconductor body toward that side of said current spreading layer which is remote from the semiconductor body, and the concentration of the metal being a highest value at an interface between the semiconductor body and the current spreading layer; a concentration of oxygen in the transparent electrically conductive metal oxide in the current spreading layer increasing in accordance with the decrease in the concentration of the metal with increasing distance from the semiconductor body; on the side of the current spreading layer which faces the semiconductor body the current spreading layer consisting of the metal that forms the transparent electrically conductive metal oxide and the current spreading layer consists of the metal oxide on its side remote from the semiconductor body, the method comprising:

applying the metal to the semiconductor body and oxidizing the metal at an increasing rate during the application and oxidation of the metal to produce the current spreading layer; and increasing the oxygen flow continuously during the application and oxidation of the metal.

2. The method as claimed in claim 1, wherein the concentration of the metal decreases continuously in the current spreading layer.

3. The method as claimed in claim 1, wherein the current spreading layer comprises in places a metal oxide having a stoichiometric composition.

4. The method as claimed in claim 1, wherein the current spreading layer comprises oxides of at least one of the following metals: indium, tin, indium-tin, zinc, cadmium, titanium.

5. The method as claimed in claim 1, wherein the current spreading layer is applied to a radiation passage area of the semiconductor body.

6. The method as claimed in claim 1, wherein the current spreading layer is formed by reactive sputtering of the metal.

7. The method as claimed in claim 1, wherein parts of the current spreading layer which consist of the metal are in direct contact with the semiconductor body.

* * * * *